US009871080B2

(12) United States Patent
Kim et al.

(10) Patent No.: US 9,871,080 B2
(45) Date of Patent: Jan. 16, 2018

(54) ORGANIC LIGHT EMITTING DIODE DISPLAY

(71) Applicant: Samsung Display Co., Ltd., Yongin-si, Gyeonggi-do (KR)

(72) Inventors: Young Do Kim, Cheonan-si (KR); Hoon Sik Kim, Seongnam-si (KR); Suk Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/067,020

(22) Filed: Mar. 10, 2016

(65) Prior Publication Data

US 2016/0322428 A1    Nov. 3, 2016

(30) Foreign Application Priority Data

Apr. 28, 2015    (KR) .................. 10-2015-0059697

(51) Int. Cl.
    H01L 29/08    (2006.01)
    H01L 27/32    (2006.01)
    H01L 51/52    (2006.01)
    H01L 51/00    (2006.01)

(52) U.S. Cl.
    CPC .......... *H01L 27/322* (2013.01); *H01L 27/323* (2013.01); *H01L 51/0067* (2013.01); *H01L 51/5246* (2013.01); H01L 51/0052 (2013.01); H01L 51/0072 (2013.01); H01L 51/5284 (2013.01)

(58) Field of Classification Search
    CPC . H01L 27/322; H01L 27/323; H01L 51/5246; H01L 51/5284; H01L 51/0052; H01L 51/0067; H01L 51/0072

USPC .... 257/40, 59, 72, 98, E51.022; 438/22, 26, 438/83, 99

See application file for complete search history.

(56) References Cited

U.S. PATENT DOCUMENTS

| 8,664,021 B2 | 3/2014 | Kim et al. | |
|---|---|---|---|
| 2008/0211394 A1* | 9/2008 | Koshihara | G06F 3/044 313/504 |
| 2010/0134426 A1* | 6/2010 | Lee | G06F 3/0412 345/173 |
| 2014/0145167 A1* | 5/2014 | Son | H01L 51/0097 257/40 |
| 2015/0041813 A1 | 2/2015 | Kim et al. | |

FOREIGN PATENT DOCUMENTS

| KR | 10-2013-0110073 A | 10/2013 |
|---|---|---|
| KR | 10-2014-0025728 A | 3/2014 |
| KR | 10-2014-0085306 A | 7/2014 |

* cited by examiner

*Primary Examiner* — Thinh T Nguyen
(74) *Attorney, Agent, or Firm* — Lewis Roca Rothgerber Christie LLP

(57) ABSTRACT

An organic light emitting diode display according to the present invention includes a substrate assembly including a substrate with a driving transistor thereon, and an organic light emitting element including a single molecular layer and configured to emit white light, a touchscreen panel on the substrate assembly, a window on the touchscreen panel, and a color filter layer on the substrate assembly and including a first color filter, a second color filter, and a third color filter, wherein the first to third color filters respectively correspond to different colors.

10 Claims, 5 Drawing Sheets

ORGANIC LIGHT EMITTING DIODE DISPLAY

CROSS-REFERENCE TO RELATED APPLICATION

This application claims priority to, and the benefit of, Korean Patent Application No. 10-2015-0059697 filed in the Korean Intellectual Property Office on Apr. 28, 2015, the entire contents of which are incorporated herein by reference.

BACKGROUND

1. Field

Embodiments of the present invention relate to an organic light emitting diode display, and more particularly, to an organic light emitting diode display having decreased thickness and increased light emission efficiency.

2. Description of the Related Art

An organic light emitting element of an organic light emitting diode display includes two electrodes and an organic light emitting layer between the two electrodes, wherein electrons injected from the electrode that is a cathode, and holes injected from the electrode that is an anode, are combined in the organic light emitting layer to form an exciton, which then discharges energy to thereby emit light.

The organic light emitting diode display includes a plurality of pixels including the organic light emitting element formed of the cathode, the anode, and the organic light emitting layer. Each pixel of the plurality of pixels includes a plurality of transistors for driving the organic light emitting element, and a storage capacitor. The plurality of transistors basically includes a switching transistor and a driving transistor.

Respective ones of the pixels may be partitioned or defined by a pixel defining layer. The pixel defining layer may define an opening corresponding to a light emitting area, and the light emitting area may be provided with the organic light emitting element including the organic light emitting layers that may respectively emit red, green, and blue light.

In addition, a configuration, such as a polarization film, a phase difference film, a black thin film, or a color filter, may be formed on the organic light emitting element, thereby forming a display panel.

In the case of the display panel having the above-mentioned configuration, thickness of the display panel may increase due to the various layers, such as the pixel defining layer, and the polarization film, the phase difference film, the black thin film, or the color filter. Because a plurality of other configurations and layers are present on the organic light emitting element, light emission efficiency may be deteriorated.

The above information disclosed in this Background section is only for enhancement of understanding, and therefore it may contain information that is not prior art, but that is already known in this country to a person of ordinary skill in the art.

SUMMARY

Embodiments of the present invention provide an organic light emitting diode display having decreased thickness and increased light emission efficiency.

In addition, aspects of embodiments the present invention are not limited to the above-mentioned features. That is, other objects that are not mentioned may be understood from the following description by those skilled in the art to which the present invention pertains.

An exemplary embodiment of the present invention provides an organic light emitting diode display including a substrate assembly including a substrate with a driving transistor thereon, and an organic light emitting element including a single molecular layer and configured to emit white light, a touchscreen panel on the substrate assembly, a window on the touchscreen panel, and a color filter layer on the substrate assembly and including a first color filter, a second color filter, and a third color filter, wherein the first to third color filters respectively correspond to different colors.

The color filter layer may be between the substrate assembly and the touchscreen panel.

The color filter layer may be between the touchscreen panel and a lower surface of the window.

The organic light emitting diode display may further include an overcoating layer covering an upper surface of the window, and the color filter layer may be between the upper surface of the window and the overcoating layer.

The color filter layer may further include black matrices between respective ones of the first color filter, the second color filter, and the third color filter.

The organic light emitting element may include a first electrode layer including an anode electrode configured to inject holes, a second electrode layer including a cathode electrode configured to inject electrons, and an organic light emitting layer between the first electrode layer and the second electrode layer, and configured to emit light when injected holes and electrons are combined.

The substrate assembly may further include an encapsulation layer covering a surface of the organic light emitting element.

The first color filter, the second color filter, and the third color filter may respectively correspond to one of red, green, and blue.

The single molecular layer may include 3-(1-(4-(4-(2-(2-hydroxyphenyl)-4,5-diphenyl-1H-imidazol-1-yl)phenoxy)phenyl)-4,5-diphenyl-1H-imidazol-2-yl)naphthalene-2-ol.

The organic light emitting diode display may further include a first adhesive layer for attaching the touchscreen panel to the substrate assembly, and a second adhesive layer for attaching the window to the touchscreen panel.

According to an embodiment of the present invention, because the pixel defining layer, the overcoating layer between the color filter layer and the first adhesive layer for protecting the color filter layer, and the polarization film may be omitted, a thinner organic light emitting diode display may be provided. In addition, because the structure stacked on the organic light emitting element may be thinner, light emission efficiency may be increased. In addition, according to an embodiment of the present invention, the organic light emitting diode display capable of decreasing external reflectivity by using the color filter layer instead the polarization film may be provided.

DETAILED DESCRIPTION

Figure 1:
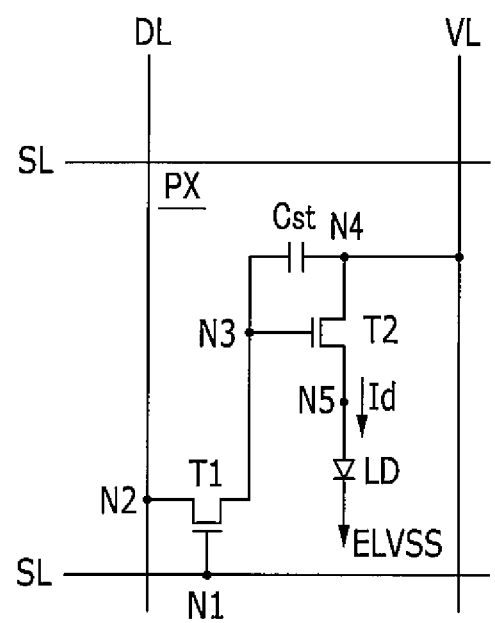
FIG. 1 is an equivalent circuit diagram of one pixel of an organic light emitting diode display.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as at "least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

First, a display panel configuring a display device according to first to third exemplary embodiments of the present invention will be described with reference to FIG. 1. That is, in the display device according to an exemplary embodiment of the present invention, a substrate, a display panel formed on the substrate, and the like will be first described.

The display device described with reference to FIG. 1 relates to an organic emitting diode (OLED) display, and FIG. 1 is an equivalent circuit diagram of one pixel of the organic light emitting diode display.

Referring to FIG. 1, the organic light emitting diode display includes a plurality of signal lines SL, DL, and VL, and a pixel PX connected to the plurality of signal lines.

The signal lines include scanning signal lines SL for transferring a gate signal (or a scan signal), data lines DL for transferring a data signal, driving voltage lines VL for transferring a driving voltage, and the like. The scanning signal lines SL generally extend in a row direction and are substantially parallel to each other, and the data lines DL generally extend in a column direction and are substantially parallel to each other. The driving voltage lines VL of the present embodiment are shown as extending in approximately the column direction, although the driving voltage lines VL of other embodiments may extend in the row direction, in the column direction, or may be formed in a mesh shape.

In the present embodiment, one pixel PX includes a thin film transistor including a switching transistor T1 and a driving transistor T2, a storage capacitor Cst, and an organic light emitting element LD. One pixel PX may additionally include a thin film transistor and a capacitor to compensate for a current provided to the organic light emitting element.

The switching transistor T1 has a control terminal N1, an input terminal N2, and an outer terminal N3, wherein the control terminal N1 is connected to the scanning signal line SL, the input terminal N2 is connected to the data line DL, and the output terminal N3 is connected to the driving transistor T2. The switching transistor T1 transfers the data signal received from the data line DL to the driving transistor T2 in response to the scan signal received from the scanning signal line SL.

In addition, the driving transistor T2 also has a control terminal N3, an input terminal N4, and an outer terminal N5, wherein the control terminal N3 is connected to the switching transistor T1, the input terminal N4 is connected to the driving voltage line VL, and the output terminal N5 is connected to the organic light emitting element LD. The driving transistor T2 allows an output current Id to flow to the organic light emitting element LD, wherein amplitude of the output current Id corresponds to a voltage between the control terminal N3 and the output terminal N5.

In this case, the storage capacitor Cst is connected between the control terminal N3 and the input terminal N4 of the driving transistor T2. The storage capacitor Cst is charged with the data signal applied to the control terminal N3 of the driving transistor T2, and holds the data signal even after the switching transistor T1 is turned-off.

The organic light emitting element LD in the present embodiment is an organic light emitting diode (OLED), by way of example, and has an anode connected to the output terminal N5 of the driving transistor T2, and has a cathode connected to a common voltage ELVSS. The organic light emitting element LD displays an image by emitting light having an intensity that corresponds to the output current Id of the driving transistor T2.

The organic light emitting element LD may include an organic material that uniquely shows white light, and the organic light emitting diode display is configured to display a desired image by a combination of lights that pass through red, green, and blue color filters, to be described in detail below.

The switching transistor T1 and the driving transistor T2 in the present embodiment are n-channel field effect transistors (FETs), although at least one of the switching transistor T1 and the driving transistor T2 of other embodiments may be a p-channel field effect transistor (FET). In addition, a connection relationship of the transistors T1 and T2, the capacitor Cst, and the organic light emitting element LD may be changed.

Figure 2:
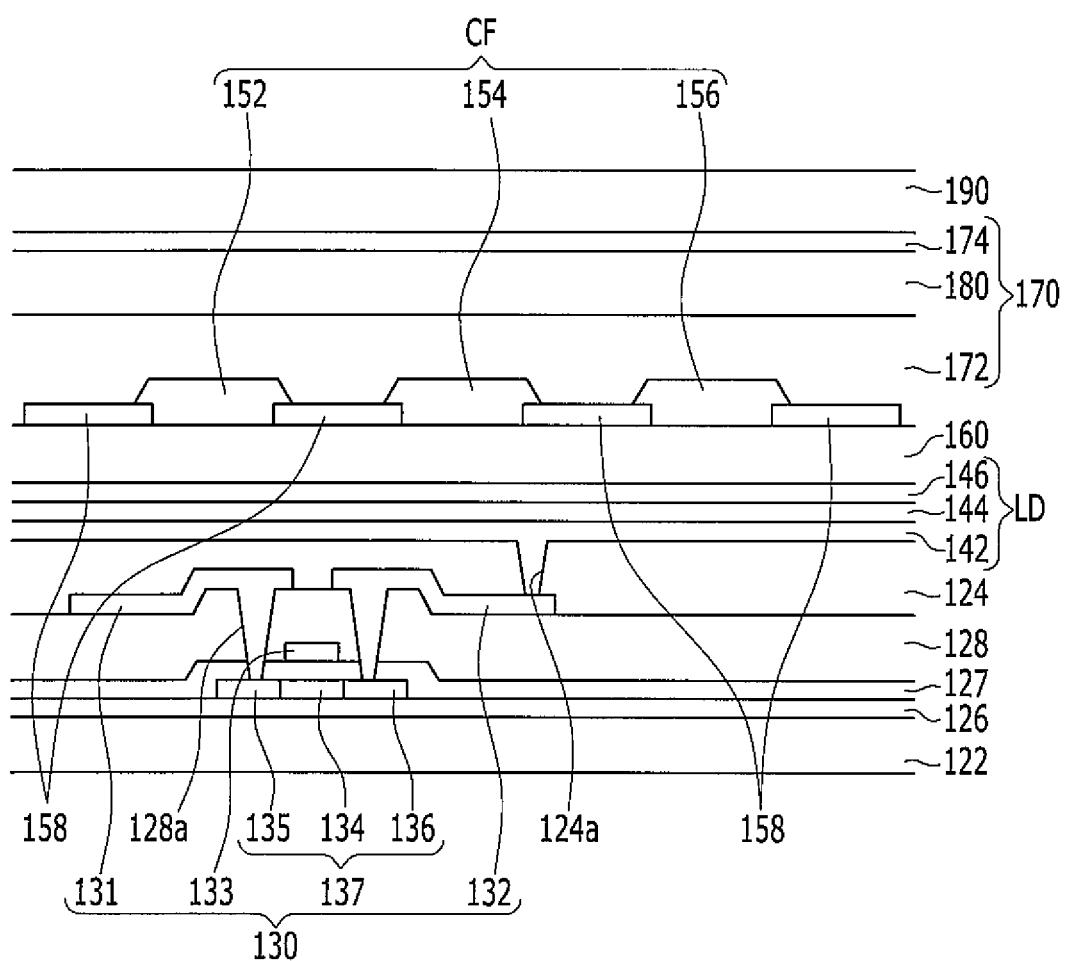
FIG. 2 is a cross-sectional view of an organic light emitting diode display according to a first exemplary embodiment of the present invention.

Hereinafter, the organic light emitting diode display according to the first to third exemplary embodiments of the present invention will be described with reference to cross-sectional views shown in FIGS. 2 to 4. FIG. 2 is a cross-sectional view of an organic light emitting diode display according to a first exemplary embodiment of the present invention, FIG. 3 is a cross-sectional view of an organic light emitting diode display according to a second exemplary embodiment of the present invention, and FIG. 4 is a cross-sectional view of an organic light emitting diode display according to a third exemplary embodiment of the present invention.

Figure 3:
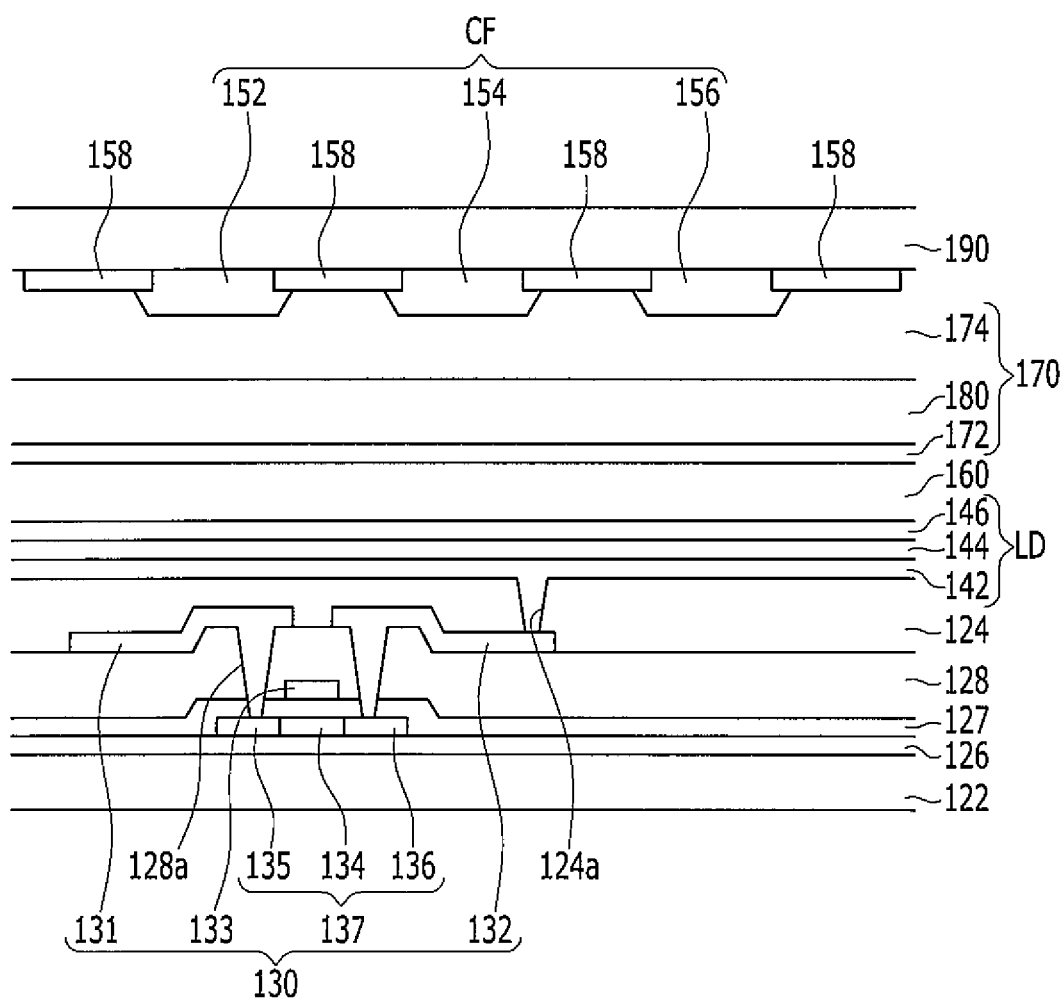
FIG. 3 is a cross-sectional view of an organic light emitting diode display according to a second exemplary embodiment of the present invention.
Figure 4:
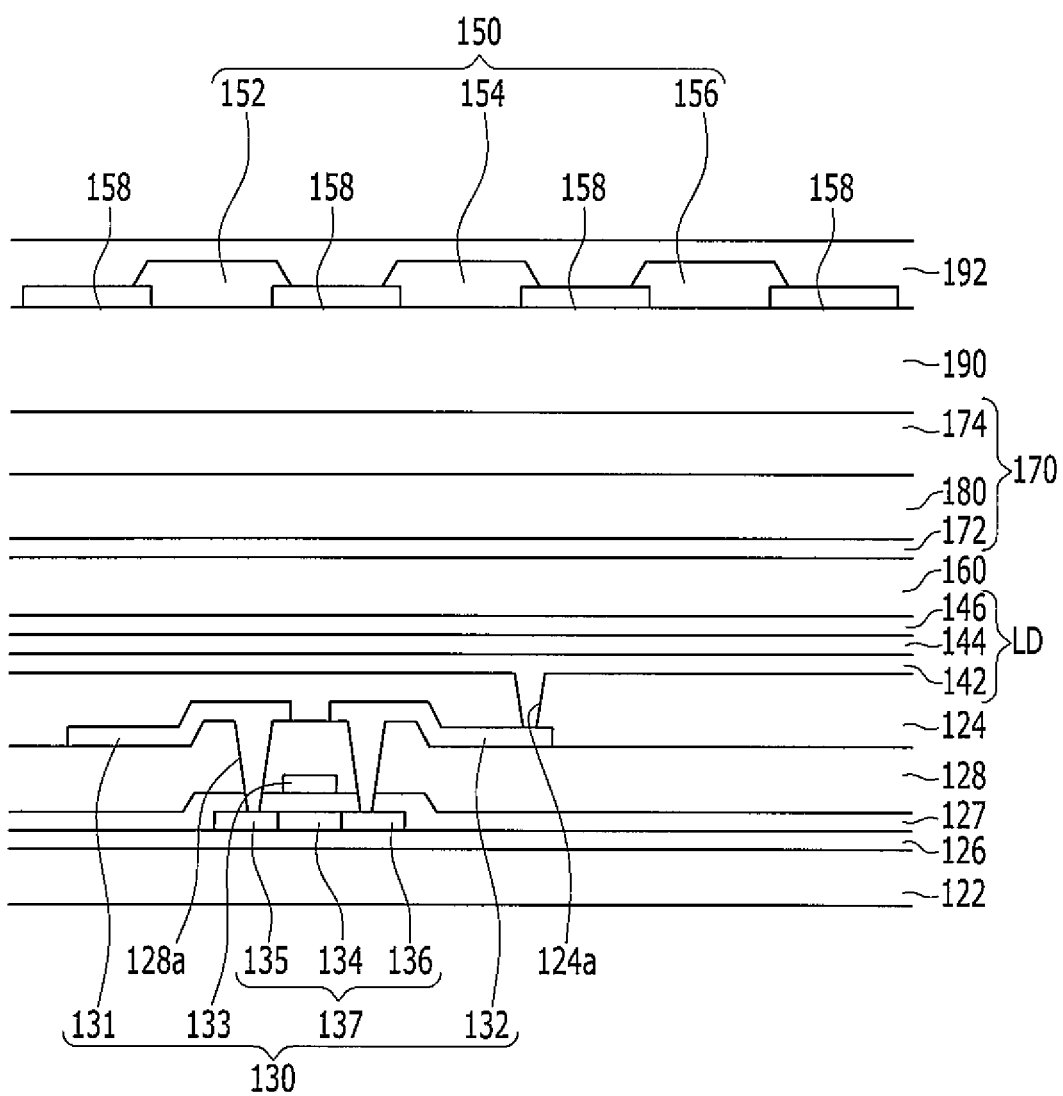
FIG. 4 is a cross-sectional view of an organic light emitting diode display according to a third exemplary embodiment of the present invention.

Referring to FIGS. 2 to 4, a substrate 122 may be formed of an insulating substrate formed of glass, quartz, ceramic, plastic, or the like. More specifically, the substrate 122 may be formed of an insulating material having flexibility, such as polyimide PI, polyetherimide PEI, polyethylene terephthalate PET, polycarbonate PC, polymethyl methacrylate PMMA, polystyrene PS, styrene acryl nitrile copolymer SAN, and silicon-acrylic resin.

A substrate buffer layer 126 is formed on the substrate 122. The substrate buffer layer 126 serves to reduce or prevent infiltration of impure elements, and to planarize a surface.

In this case, the substrate buffer layer 126 may be formed of various materials capable of performing the above-mentioned functions. For example, as the substrate buffer layer 126, any one of silicon nitride ($SiN_x$), silicon oxide ($SiO_2$), and silicon oxynitride ($SiO_xN_y$) may be used. However, the substrate buffer layer 126 may be omitted in other embodiments of the present invention depending on a kind of substrate 122 and a processing condition.

A driving semiconductor layer 137 is formed on the substrate buffer layer 126, and may be formed of polycrystalline silicon. In addition, the driving semiconductor layer 137 includes a channel region 135, in which impurities are not doped, and a source region 134 and a drain region 136 doped and formed at respective sides of the channel region 135. In this case, a doped ion material is a p-type impurity such as boron B, and $B_2H_6$ may be used. Here, the above-mentioned impurity is varied depending on a kind of thin film transistor.

A gate insulating layer 127 formed of silicon nitride ($SiN_x$), silicon oxide ($SiO_2$), or the like is formed on the driving semiconductor layer 137. A gate wire including a driving gate electrode 133 is formed on the gate insulating layer 127. In addition, the driving gate electrode 133 is formed to overlap at least a portion of the driving semiconductor layer 137, particularly, the channel region 135.

Meanwhile, an interlayer insulating layer 128 covering the driving gate electrode 133 is formed on the gate insulating layer 127. A contact hole(s) 128a exposing the source region 134 and the drain region 136 of the driving semiconductor layer 137 is formed in the gate insulating layer 127 and in the interlayer insulating layer 128. Similar to the gate insulating layer 127, the interlayer insulating layer 128 may be formed of a ceramic based material, such as silicon nitride ($SiN_x$), silicon oxide ($SiO_2$), or the like.

In addition, a data wire including a driving source electrode 131 and a driving drain electrode 132 is formed on the interlayer insulating layer 128. In addition, the driving source electrode 131 and the driving drain electrode 132 are respectively connected to the source region 134 and the drain region 136 of the driving semiconductor layer 137 through the contact hole(s) 128a formed in the interlayer insulating layer 128 and in the gate insulating layer 127.

As such, the driving thin film transistor 130, which is configured to include the driving semiconductor layer 137, the driving gate electrode 133, the driving source electrode 131, and the driving drain electrode 132, is formed. The configuration of the driving thin film transistor 130 is not limited to the example described above, and may be variously modified in known configurations that may be easily implemented by those skilled in the art.

In addition, a planarization layer 124 covering the data wire (i.e., the driving source electrode 131 and the driving drain electrode 132) is formed on the interlayer insulating layer 128. The planarization layer 124 serves to remove/planarize a step to increase light emission efficiency of the organic light emitting element LD to be formed thereon. In addition, the planarization layer 124 has an electrode via hole 124a exposing a portion of the drain electrode 132.

The planarization layer 124 may be formed of one or more materials of a polyacrylates resin, an epoxy resin, a phenolic resin, a polyamides resin, a polyimides resin, an unsaturated polyesters resin, a poly phenylenethers resin, a poly phenylenesulfides resin, and benzocyclobutene (BCB).

Here, the exemplary embodiment of the present invention is not limited to the structure described above, and any one of the planarization layer 124 and the interlayer insulating layer 128 may be omitted.

In the present embodiment, a first electrode layer 142 of the organic light emitting element is formed on the planarization layer 124. The first electrode layer 142 is connected to the drain electrode 132 through the electrode via hole 124a of the planarization layer 124.

An organic light emitting layer 144 is formed on the first electrode layer 142, and a second electrode layer 146 is formed on the organic light emitting layer 144. As such, the organic light emitting element LD including the first electrode layer 142, the organic light emitting layer 144, and the second electrode layer 146 is formed.

Here, the first electrode layer 142 is an anode electrode, which is a hole injecting electrode, and the second electrode layer 146 is a cathode electrode, which is an electron injecting electrode. However, the exemplary embodiment of the present invention is not necessarily limited thereto, and depending on a driving method of the organic light emitting diode display, the first electrode layer 142 may alternatively be the cathode electrode while the second electrode layer 146 is the anode electrode. The holes and the electrons are injected into the organic light emitting layer 144 from the first electrode layer 142 and the second electrode layer 146, respectively, and when an exciton formed by coupling the injected holes and electrons is dropped from an excited state to a ground state, light emission occurs.

The organic light emitting layer 144 may be formed of 3-(1-(4-(4-(2-(2-hydroxyphenyl)-4,5-diphenyl-1H-imidazol-1-yl)phenoxy)phenyl)-4,5-diphenyl-1H-imidazol-2-yl)naphthalene-2-ol. This material, which is an organic light emitting material using an "Excited-State Intra molecular Proton Transfer(ESIPT)" phenomenon, may emit white light by a partial energy transfer due to an enol-keton change. A chemical formula of 3-(1-(4-(4-(2-(2-hydroxyphenyl)-4,5-diphenyl-1H-imidazol-1-yl)phenoxy)phenyl)-4,5-diphenyl-1H-imidazol-2-yl)naphthalene-2-ol is as illustrated in the following Chemical Formula 1.

Chemical Formula 1

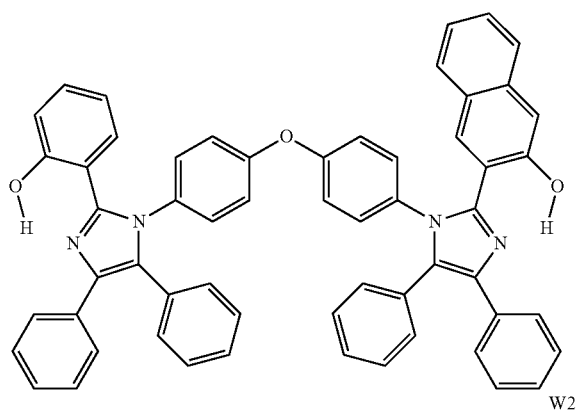

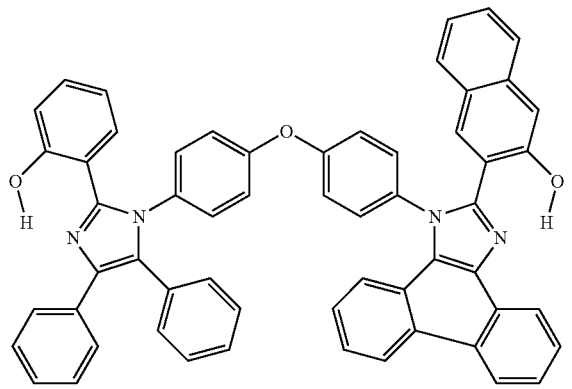

However, the material described in Chemical Formula 1 is merely an exemplary embodiment of the present invention, and as long as the material is the organic light emitting material capable of emitting white light using a single molecule layer, it may be included in the scope of the present invention.

In addition, the organic light emitting layer 144 according the present exemplary embodiment may be formed of a multi-layer including one or more of a light emitting layer, a hole injection layer (HIL), a hole transporting layer (HTL), an electron transporting layer (ETL), and an electron injection layer (EIL). In the case in which the organic light emitting layer 144 includes all of the above-mentioned layers, the hole injection layer is located on the first electrode layer 142, which is an anode electrode, on which the hole transporting layer, the light emitting layer, the electron transporting layer, and the electron injection layer are sequentially staked.

The organic light emitting layer 144 according to the present exemplary embodiment, which is a white organic light emitting layer emitting white light, may implement a color image by forming a first color filter, a second color filter, and a third color filter, which respectively correspond to red, green, and blue, on a substrate assembly including the organic light emitting element. The first color filter, the second color filter, and the third color filter are each formed so as to have one color different from that of the others (e.g., the three color filters may respectively be red, green, and blue).

In the case in which the color image is implemented by using the white organic light emitting layer and by using the color filter layer including the first color filter, the second color filter, and the third color filter, because a deposition mask for depositing a red organic light emitting layer, a green organic light emitting layer, and a blue organic light emitting layer on the respective individual pixels (e.g., a red pixel, a green pixel, and a blue pixel) may be omitted, and because the red organic light emitting layer, the green organic light emitting layer, and the blue organic light emitting layer may be omitted, costs are saved. In addition, because a pixel defining layer formed to define an area for each individual pixel may be omitted, an overall thickness of the organic light emitting diode display may be reduced. In addition, because flatness of the organic light emitting diode display according to the present exemplary embodiment may be increased, cracking that may otherwise occur by folding the organic light emitting diode display having flexibility may be reduced or prevented. Meanwhile, the color filter layer will be described in more detail below.

The second electrode layer 146 may be formed on the organic light emitting layer 144 according to the present exemplary embodiment. As such, the organic light emitting element LD including the first electrode layer 142, the organic light emitting layer 144, and the second electrode layer 146 is formed.

In this case, the first electrode layer 142 and the second electrode layer 146 may be each formed of a transparent conductive material, or may be each formed of a transflective or reflective conductive material. Depending on a kind of material forming the first electrode layer 142 and the second electrode layer 146, the organic light emitting diode display may be a front light emitting type, a rear light emitting type, or a double-sided light emitting type (e.g., a dual emission type).

Meanwhile, an overcoating layer for covering and protecting the second electrode layer 146 may be formed on the second electrode layer 146 (e.g., as an organic layer).

In addition, an encapsulation layer 160 may be formed on the overcoating layer. The encapsulation layer 160 encapsulates and protects both the organic light emitting element LD and a driving circuit part formed on the substrate 122 (e.g., from external impurities).

The encapsulation layer 160 according to the present exemplary embodiment may be an encapsulation member that encapsulates the substrate assembly by a sealant, wherein the sealant used as the encapsulation member may be formed of various materials, such as glass, quartz, ceramic, plastic, metal, and the like.

Meanwhile, a thin film encapsulation layer may also be formed by depositing an inorganic layer and an organic layer on the second electrode layer 146 without using the sealant. The thin film encapsulation layer includes an encapsulation organic layer, and an encapsulation inorganic layer, which are alternately stacked. By way of example, two encapsulation organic layers and two encapsulation inorganic layers may be alternately stacked to configure the encapsulation layer 160, although the present invention is not limited thereto.

According to the present exemplary embodiment, the color filter layer CF including the first color filter 152, the second color filter 154, and the third color filter 156, the color filters 152, 154, and 156 having different colors from each other, may be formed on the substrate assembly. When the color filter layer CF is referred to as being formed "on" the substrate assembly, the color filter layer CF may be formed immediately on the substrate assembly to be in contact with the substrate assembly as described above, or the color filter layer CF may be formed at an upper side of the substrate assembly with other intervening elements being present between the color filter layer CF and the substrate assembly, all of which may be included in the scope of the present invention. Therefore, the color filter layer CF according to the present exemplary embodiment may be formed at any position of the substrate assembly as described above.

The first to the third exemplary embodiments of the present invention to be described below may be distinguished depending on the position at which the color filter layer CF is formed. According to the first to third exemplary embodiments of the present invention, as shown in FIG. 2, the color filter layer CF may be located between a first adhesive layer 172 and the rest of the substrate assembly, as shown in FIG. 3, the color filter layer CF may be formed on a lower surface of a window 190 and located between a second adhesive layer 174 and the window 190, and as shown in FIG. 4, the color filter layer CF may be formed on an upper surface of the window 190 and an overcoating layer 192 may further formed on the color filter layer CF.

According to the first exemplary embodiment of the present invention shown in FIG. 2, the color filter layer CF including the first color filter 152, the second color filter 154, and the third color filter 156 may be attached to the substrate assembly to be between the rest of the substrate assembly and the first adhesive layer 172.

The first adhesive layer 172 according to present exemplary embodiment may include silicon, such as a pressure sensitive adhesive (PSA) having a low modulus value, or an acrylic based compressive adhesive may be used, although the present embodiment is not limited thereto. In this case, the overcoating layer formed on the color filter layer CF may be omitted, and even when the overcoating layer is omitted, a surface may be planarized by the pressure sensitive adhesive having low modulus. Therefore, a total of thickness of the organic light emitting diode display may be reduced.

The pressure sensitive adhesive will be described in more detail. The pressure sensitive adhesive having a modulus measurement value of about 5 MPa or less at about −20° C. and about 0.3 MPa or less at room temperature in a shear mode of a dynamic mechanical analysis (DMA) may be used.

A touchscreen panel 180 may be formed on the first adhesive layer 172 as described above. According to the present exemplary embodiment, because the pixel defining layer and the overcoating layer are omitted, and because the organic light emitting element LD, the encapsulation layer 160, the color filter layer CF, and the first adhesive layer 172 are formed between the touchscreen panel 180 and the substrate assembly, a total of thickness of the organic light emitting diode display may be reduced.

A second adhesive layer 174 may be formed on the touchscreen panel 180, and the window 190 may be attached to the touchscreen panel 180 by the second adhesive layer 174.

Similar to the first adhesive layer 172, the second adhesive layer 174 according to present exemplary embodiment may include silicon, such as the PSA having the low modulus value, and acrylic based compressive adhesive may also be used, although the present embodiment is not limited thereto. In addition, a plurality of adhesive layers 170 including the first adhesive layer 172 and the second adhesive layer 174 may be formed of the same material.

According to the second exemplary embodiment of the present invention shown in FIG. 3, the color filter layer CF including the first color filter 152, the second color filter 154, and the third color filter 156 may be attached to the lower surface of the window 190 to be located between the second adhesive layer 174 and the window 190.

Similar to the first exemplary embodiment, the first adhesive layer 172 is formed on the substrate assembly, and the touchscreen panel 180 is attached onto the first adhesive layer 172. The second adhesive layer 174 is formed on the touchscreen panel 180, and the window 190 having the color filter layer CF formed thereon is attached onto the second adhesive layer 174. In this case, as described above, the color filter layer CF is located between the second adhesive layer 174 and the window 190.

The color filter layer CF of the present embodiment is located between the second adhesive layer 174 and the window 190 so as not to be in contact with the touchscreen panel 180, thereby making it possible to reduce or prevent damage of the color filter layer CF due to a heating of the touchscreen panel 180, and to reduce or prevent chemical damage of the color filter layer CF due to material diffusion with the touchscreen panel 180.

According to the third exemplary embodiment of the present invention shown in FIG. 4, the color filter layer CF including the first color filter 152, the second color filter 154, and the third color filter 156 may be attached to the upper surface of the window 190, and the overcoating layer 192 for protecting the color filter layer CF and the upper surface of the window 190 may be further formed.

Similar to the second exemplary embodiment of the present invention, the color filter layer CF according to the third exemplary embodiment of the present invention is also located on the upper surface of the window so as not to contact the touchscreen panel 180, thereby making it possible to reduce or prevent damage of the color filter layer CF due to the heating of the touchscreen panel 180, and to reduce or prevent chemical damage of the color filter layer CF due to the material diffusion with the touchscreen panel 180.

In the present embodiment, because the color filter layer CF located on the upper layer of the window 190 may be exposed to the external environment (e.g., outside the display panel), the overcoating layer 192 for protecting the color filter layer CF from an external environment may be further formed. The overcoating layer 192 according to the present exemplary embodiment is formed so as to surround all of an otherwise exposed surface of the color filter layer CF, and a surface of the window 190 of a region in which the color filter layer CF is not formed, thereby protecting both the surface of the color filter layer CF and the window 190.

The color filter layer CF according to the first to third exemplary embodiments of the present invention may further include black matrices 158. The black matrices 158 may each be formed between the first color filter 152, the second color filter 154, and the third color filter 156 of the color filter layer CF, and may partition an emission region of lights passing through the color filters so that lights passing through adjacent color filters 152, 154, and 156 may be emitted without being mixed or overlapped with each other, thereby improving color purity. That is, lights having different colors upon passing through the first color filter 152, the second color filter 154, and the third color filter 156 may be individually emitted to the outside without overlapping or mixing with each other, due to the black matrices 158.

Figure 5:
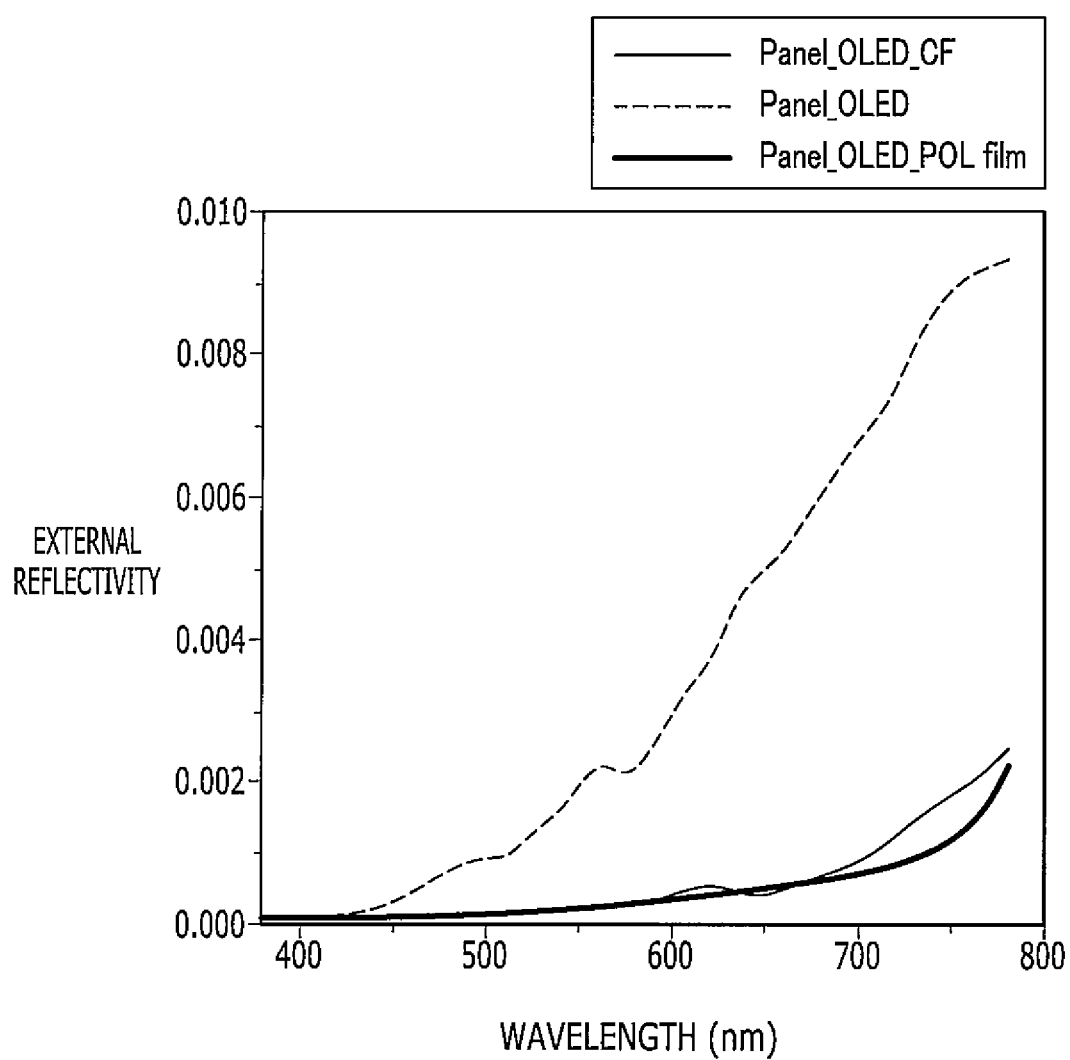
FIG. 5 is a graph illustrating an effect in which external reflection is reduced by the organic light emitting diode display according to an exemplary embodiment of the present invention.

FIG. 5 is a graph illustrating an effect in which external reflection is reduced by the organic light emitting diode display according to an exemplary embodiment of the present invention. As shown in FIG. 5, an organic light emitting diode display (Panel_OLED) without a polarization film or a color filter layer has high external reflectivity, as compared to an organic light emitting diode display (Panel_OLED_POL film) and to an organic light emitting diode display (Panel_OLED_CF) including the color filter layer as in the present exemplary embodiment. That is, the organic light emitting diode display including the color filter layer as in the present exemplary embodiment has reduced external reflectivity when compared to the organic light emitting diode display that does not include the color filter, and may have an effect (e.g., reduced external reflectivity) that is comparable to the organic light emitting diode display including the polarization film.

Hereinabove, the organic light emitting diode displays according to the first to third exemplary embodiments of the present invention have been described. However, the present invention is not limited to only the exemplary embodiments described above, and the exemplary embodiments described above are merely portions of exemplary embodiments of the present invention.

According to an embodiment of the present invention, because the pixel defining layer, the overcoating layer between the color filter layer and the first adhesive layer, and the polarization film may be omitted, a thinner organic light emitting diode display may be provided. In addition, because the structure stacked on the organic light emitting element may be relatively thinner, light emission efficiency may be increased.

In addition, according to an embodiment of the present invention, the organic light emitting diode display capable of decreasing external reflectivity by using the color filter layer instead the polarization film may be provided.

Although the specific exemplary embodiments of the present invention have been described and shown, the present invention is not limited thereto, and those skilled in the art will appreciate that various modifications, additions, and substitutions are possible without departing from the scope and spirit of the invention. Accordingly, such modifications, additions and substitutions are not to be separately interpreted from the spirit and scope of the present invention, and should also be understood to fall within the scope of the present invention as disclosed in the following claims and their equivalents.

| Description of Some of the Reference Characters | |
| --- | --- |
| 122: substrate | 124: planarization layer |
| 124a: electrode via hole | 126: substrate buffer layer |
| 127: gate insulating layer | 128: interlayer insulating layer |
| 128a: contact hole | 130: driving thin film transistor |
| 131: driving source electrode | 132: driving drain electrode |
| 133: driving gate electrode | 134: source region |

-continued

Description of Some of the Reference Characters

| | |
|---|---|
| 135: channel region | 136: drain region |
| 137: driving semiconductor layer | 142: first electrode layer |
| 144: organic emitting layer | 146: second electrode layer |
| 152: first color filter | 154: second color filter |
| 156: third color filter | 158: black matrix |
| 160: encapsulation layer | 172: first adhesive layer |
| 174: second adhesive layer | 180: touchscreen panel |
| 190: window | 192: overcoating layer |
| CF: color filter layer | LD: organic light emitting element |

What is claimed is:

1. An organic light emitting diode display comprising:
a substrate assembly comprising a substrate with a driving transistor thereon, and an organic light emitting element comprising an organic light emitting layer having a single molecular layer and configured to emit white light;
a touchscreen panel on the substrate assembly;
a window on the touchscreen panel; and
a color filter layer on the substrate assembly and comprising a first color filter, a second color filter, and a third color filter, wherein the first to third color filters respectively correspond to different colors,
wherein portions of the organic light emitting layer overlapping with different color filters are connected to each other.

2. The organic light emitting diode display of claim 1, wherein the color filter layer is between the substrate assembly and the touchscreen panel.

3. The organic light emitting diode display of claim 1, wherein the color filter layer is between the touchscreen panel and a lower surface of the window.

4. The organic light emitting diode display of claim 1, further comprising an overcoating layer covering an upper surface of the window, wherein the color filter layer is between the upper surface of the window and the overcoating layer.

5. The organic light emitting diode display of claim 1, wherein the color filter layer further comprises black matrices between respective ones of the first color filter, the second color filter, and the third color filter.

6. The organic light emitting diode display of claim 1, wherein the organic light emitting element comprises:
a first electrode layer comprising an anode electrode configured to inject holes; and
a second electrode layer comprising a cathode electrode configured to inject electron,
wherein the organic light emitting layer between the first electrode layer and the second electrode layer is configured to emit light when the injected holes and electrons are combined.

7. The organic light emitting diode display of claim 1, wherein the substrate assembly further comprises an encapsulation layer covering a surface of the organic light emitting element.

8. The organic light emitting diode display of claim 1, wherein the first color filter, the second color filter, and the third color filter respectively correspond to one of red, green, and blue.

9. The organic light emitting diode display of claim 1, wherein the single molecular layer comprises 3-(1-(4-(4-(2-(2-hydroxyphenyl)-4,5-diphenyl-1H-imidazol-1-yl)phenoxy)phenyl)-4,5-diphenyl-1H-imidazol-2-yl)naphthalene-2-ol.

10. The organic light emitting diode display of claim 1, further comprising:
a first adhesive layer for attaching the touchscreen panel to the substrate assembly; and
a second adhesive layer for attaching the window to the touchscreen panel.

* * * * *